United States Patent [19]

Adam

[11] Patent Number: 4,597,000
[45] Date of Patent: Jun. 24, 1986

[54] FLOATING-GATE MEMORY CELL

[75] Inventor: Fritz G. Adam, Freiburg, Fed. Rep. of Germany

[73] Assignee: ITT Industries, Inc., New York, N.Y.

[21] Appl. No.: 419,888

[22] Filed: Sep. 20, 1982

[30] Foreign Application Priority Data

Oct. 19, 1981 [DE] Fed. Rep. of Germany ....... 3141390

[51] Int. Cl.[4] ...................... H01L 29/78; G11C 11/34
[52] U.S. Cl. .................... 357/23.5; 357/54; 357/41; 365/185
[58] Field of Search ................. 357/23 VT, 23.5, 41, 357/54; 365/185, 182, 184

[56] References Cited

U.S. PATENT DOCUMENTS

| 4,016,588 | 4/1977 | Ohya et al. ................ 357/23 VT |
| 4,305,083 | 12/1981 | Gutierrez ................... 357/54 |
| 4,412,311 | 10/1983 | Miccoli et al. ............. 365/185 |
| 4,451,904 | 5/1984 | Sugiura ..................... 357/23.5 |

FOREIGN PATENT DOCUMENTS

| 0035160 | 9/1981 | European Pat. Off. ......... 365/185 |
| 2759039 | 7/1979 | Fed. Rep. of Germany ....... 357/23 VT |
| 0156484 | 12/1979 | Japan ..................... 357/23 VT |
| 0071072 | 5/1980 | Japan ..................... 357/23 VT |
| 0021777 | 1/1981 | Japan ..................... 365/185 |
| 2032687 | 5/1980 | United Kingdom .......... 357/23 VT |
| 2073484 | 10/1981 | United Kingdom .......... 357/23 VT |

OTHER PUBLICATIONS

IEEE Transactions on Electron Devices, vol. ED. 24, #5, May 1977, pp. 594–599, by Gosney.
IBM Technical Disclosure Bulletin "Electrically Rewritable Nonvolatile Memory", vol. 16, #2, Jul. 73; James.
IBM Technical Disclosure Bulletin, vol. 16, #2, Jul. 73, "Floating Gate FET Memory" by Chiu, Pan, Tsang.
IBM Technical Disclosure Bulletin by vol. 17, #8, Jan. 75, "Electrically Erasable Floating Gate", FET Memory Cell, Anantha.
Electronic Design, Nov. 8, 1980—Tom Williams "Memory, GaAs Technologies Keep Improving".

Primary Examiner—Martin H. Edlow
Assistant Examiner—Mark Prenty
Attorney, Agent, or Firm—Donald J. Lenkszus

[57] ABSTRACT

A memory cell includes a selection transistor and a memory transistor formed as insulated gate field effect transistors. The transistors are formed on a substrate with a channel for the selection transistor coupled to a channel for the memory transistor. A layer of oxide overlies both transistors. The channels are formed between a programming line and a reading line formed in the substrate. A thin film window in the oxide overlies a region of the programming line. An insulated, floating gate is formed overlying the window and the channel of the memory transistor. A gate electrode overlies the floating gate and the channel of the selection transistor.

10 Claims, 7 Drawing Figures

FIG. 7

|  | 11 | | | 12 | | | 21 | | | 22 | | |
|---|---|---|---|---|---|---|---|---|---|---|---|---|
|  | $G_1$ | $Y_1$ | $X_1$ | $G_1$ | $Y_2$ | $X_2$ | $G_2$ | $Y_1$ | $X_1$ | $G_2$ | $Y_2$ | $X_2$ |
| E 11 | 0 | $U_P$ | $U_P$ | 0 | $U_{P/2}$ | $U_{P/2}$ | $U_{P/2}$ | $U_P$ | $U_P$ | $U_{P/2}$ | $U_{P/2}$ | $U_{P/2}$ |
| W 11 | $U_P$ | $U_P$ | $U_P$ | $U_P$ | $U_{P/2}$ | $U_{P/2}$ | $U_{P/2}$ | $U_P$ | $U_P$ | $U_{P/2}$ | $U_{P/2}$ | $U_{P/2}$ |
| R 11 | $U_R$ | $U_D$ | 0 | $U_R$ | $U_D$ | $U_D$ | 0 | $U_D$ | 0 | 0 | $U_D$ | $U_D$ |
| R11,12 | $U_R$ | $U_D$ | 0 | $U_R$ | $U_D$ | 0 | 0 | $U_D$ | 0 | 0 | $U_D$ | 0 |
| E11,12 | 0 | $U_P$ | $U_P$ | 0 | $U_P$ | $U_P$ | $U_{P/2}$ | $U_P$ | $U_P$ | $U_{P/2}$ | $U_P$ | $U_P$ |
| W11,12 | $U_P$ | $U_P$ | $U_P$ | $U_P$ | $U_P$ | $U_P$ | $U_{P/2}$ | $U_P$ | $U_P$ | $U_{P/2}$ | $U_P$ | $U_P$ |
| E11,12 | 0 | $U_P$ | $U_P$ | 0 | $U_{P/2}$ | $U_{P/2}$ | 0 | $U_P$ | $U_P$ | 0 | $U_{P/2}$ | $U_{P/2}$ |
| W11,12 | $U_P$ | $U_P$ | $U_P$ | $U_P$ | $U_{P/2}$ | $U_{P/2}$ | $U_P$ | $U_P$ | $U_P$ | $U_P$ | $U_{P/2}$ | $U_{P/2}$ |

FIG. 6

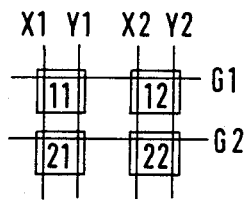

FLOATING-GATE MEMORY CELL

BACKGROUND OF THE INVENTION

1. Field of the Invention

The invention relates to a floating-gate memory cell, i.e., a memory cell comprising a gate electrode which is floating with respect to potential and which, by way of injecting hot charge carriers through a thin oxide layer between the substrate crystal and the electrode, is charged or discharged, with the threshold value of a memory transistor designed as an insulated-gate field-effect transistor, being shifted. The writing, for example is effected by way of injecting hot electrons, and the erasing is effected by injecting hot holes.

2. Description of the Prior Art

Memory cells of this kind are known from the following articles:

(a) W. M. Gosney, "IEEE Trans. on Electron Devices", May 1977, pp. 594 to 599, "DIFMOS-A Floating Gate Electrically Erasable Nonvolatile Semiconductor Memory Technology"

(b) T. Ito et al, "IEEE Trans. on Electron Devices", June 1979, pp. 906 to 913, "Low Voltage Alterable EAROM Cells with Nitride-Barrier Avalanche-Injection MIS (NAMIS)".

The memory cell known by the acronym DIFMOS for dual injector floating-gate MOS, has on one hand the following drawbacks:

For its manufacture, there is employed the AL-gate p-channel technology, so that for one cell there is required a relatively large surface area (25,800 $\mu m^2$).

It requires separate diode structures with a special doping, i.e. a $P^{++}/N^+$ structure for the electron injection, and a $N^{++}/P^+$ structure for the hole injections.

It is not compatible with the modern n-channel Si-gate technology.

On the other hand, the "NAMIS" memory cell is known to have the following drawbacks:

The injection takes place within the channel area of the memory transistor, so that in a relatively short period of time, the characteristic of the memory transistor becomes changed owing to charges trapped in the gate insulator.

Between the floating-gate electrode and the channel area there is used an extremely thin thermal nitride (9.5 nm) which, for its manufacture, requires a thermal nitration process requiring high temperatures ranging between 1,200° and 1,300° C. which are not compatible with modern standard technologies.

SUMMARY OF THE INVENTION

Accordingly, the invention relates to a floating-gate memory cell in which the writing and the erasing is effected by the injection of hot charge carriers, consisting of a series arrangement of a memory transistor (Ts) and of a selection transistor (Ta) which are both designed as insulated-gate field-effect transistors, of which the memory transistor (Ts) comprises a gate electrode (Fg) which is floating with respect to the potential.

It is the object of the invention to provide a space-saving floating-gate memory cell of this kind, with the injection of charge carriers being carried out outside the transistor channel area, i.e., for electrons and holes on very closely neighboring points on the one or on the other side of a pn-junction respectively.

According to the invention, this object is achieved by a structure wherein the channel area (Cs) of said memory transistor (Ts) changes over directly into the channel area (Ca) of said selection transistor (Ta) and is arranged within a common-gate oxide area (Co) which, on the side of said selection transistor, overlaps the reading line region (Y) and, on the side of said memory transistor, is provided with an extension (Cf) projecting over the opposite margin (8), or edge, of the programming line region (X), with a portion (Cp); within the boundaries of said projecting portion (Cp) of said extension (Cf), the substrate (1), below said gate oxide area (Co) comprises a superficially inserted programming region (Pz) of increased substrate doping; said floating gate (Fg) overlaps the entire gate oxide area (Co) with the exception of said channel area (Ca) belonging to said selection transistor (Ta), as well as the adjoining areas of the field oxide (4); and for the insulating and capacitive coupling purpose, said superficially oxidized floating gate (Fg) and said channel area (Ca) of said selection transistor (Ta) are covered by a control gate (G) which, just like the reading line region (Y) and the programming line region (X), is led out as a third electrode of the memory cell.

The aforementioned pn-junction is formed on the border between the $n^+$-doped programming line region X and the $p^+$-doped programming region Pz.

The mode of operation of the memory cell according to the invention is based on the fact that, upon the application of a positive programming pulse to the gate electrode, by simultaneously applying the programming voltage to the pn-junction, the maximum field intensity will appear on the $p^+$-side of the junction below the thin oxide within the extension of the gate oxide area, and effects the injection of hot electrons, whereas upon application of a negative pulse, the maximum field intensity appears on the $n^+$-side of the junction below the thin oxide, and leads to the injection of hot holes.

In further embodying the idea of the invention, the programming voltage can be reduced in that the gate oxide within the area of the extension, is provided with a thin-film window having a particularly thin oxide. As the material for the floating gate, there is preferably used a doped polycrystalline silicon, because this material can be relatively easy thermally oxidized, so that the floating gate can be easily separated electrically from the control gate. The control gate can likewise be made from a doped polycrystalline silicon or else of a metal, preferably aluminum.

DESCRIPTION OF THE DRAWINGS

FIG. 6 schematically shows a 2×2 matrix.

FIG. 7 shows a table indicating various programming possibilities of the matrix of FIG. 6.

DESCRIPTION OF THE INVENTION

Figure 1:
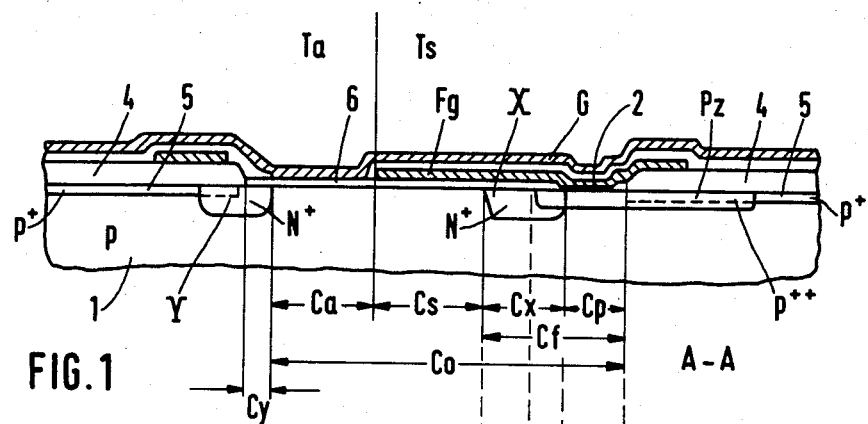
FIG. 1 is a sectional representation of part of an integrated solid-state circuit, showing a floating-gate memory cell according to the invention.

With a view to the compatibility with the presently preferred n-channel technologies, the floating gate memory cell according to the invention is preferably produced on the surface of a p-conducting substrate 1 or on a p-conducting substrate region. This, however, shall not exclude the realization thereof with inverted polarities.

With the aid of two masked implantation processes, the dopings of the programming region Pz on the one hand, and of the line regions X and Y on the other hand, are inserted into the surface of the semiconductor. As is nowadays customary with the modern n-channel technologies for the active regions, the gate oxide surfaces Co are then masked with nitride. By way of a thermal oxidation, there is then produced a field oxide 4 outside the rim portion 3 of the surface Co as covered with nitride. Following the removal of the nitride mask, there is effected the thermal production of the gate oxide 6.

In order to facilitate the tunneling of the hot charge carriers, the gate oxide area Co is provided with a thin-film window 2 having a thickness ranging between 30 and 80 nm.

Figure 2:
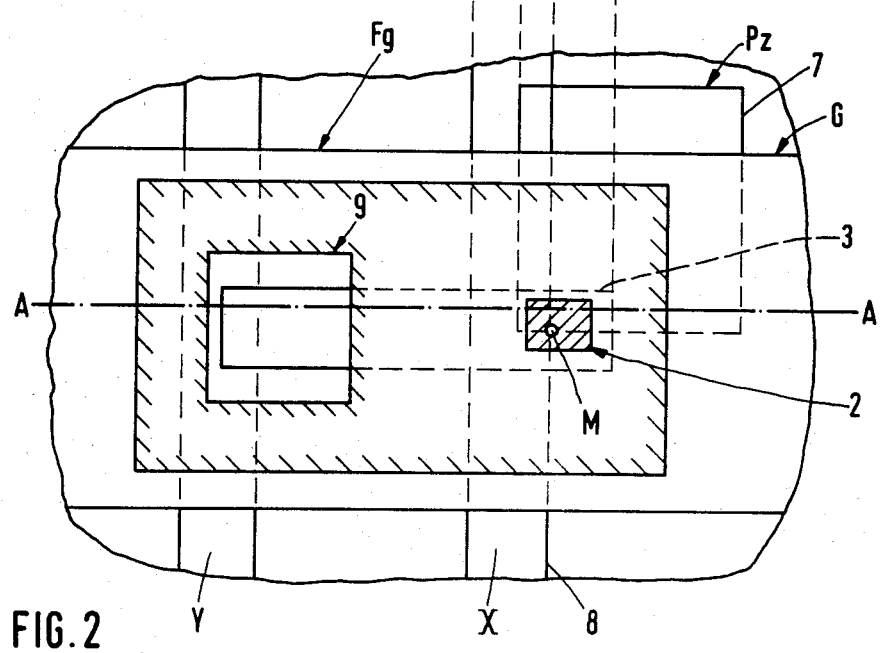
FIG. 2 is a top view of the present invention.
Figure 4:
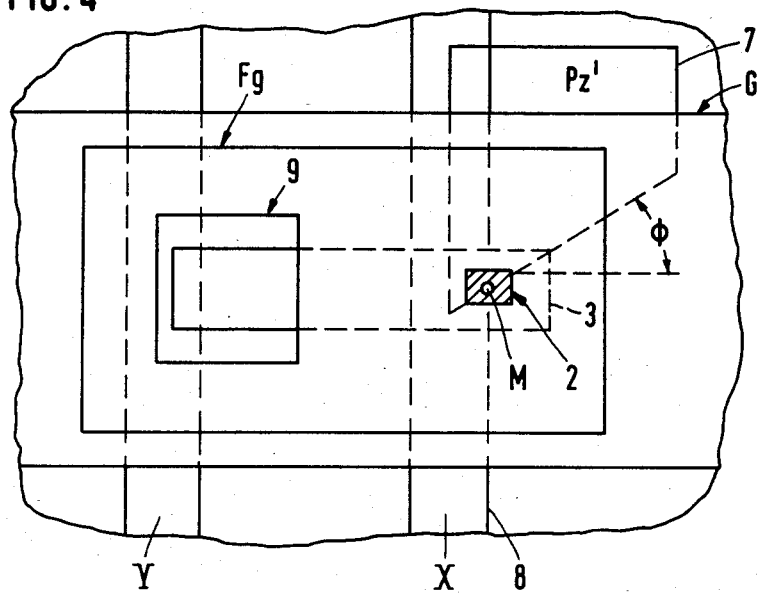
FIG. 4 shows a further embodiment of the floating-gate memory cell according to the invention.

In the examples of embodiment as shown in FIGS. 2 and 4, approximately on the point intersecting the bordering lines of the programming line region X and the programing region Pz, a small portion of the gate oxide area Co is designed as a thin-film window 2 having such a thin oxide layer that the charge carrier injections are possible also at a particularly low programing voltage.

In the aforementioned masking processes, the rim portion of the gate oxide 6, with respect to the line regions X and Y, is to be placed in such a way that the gate oxide 6 on one hand, slightly overlaps the reading line region Y and, on the other hand, forms an area Cp extending beyond the programing line region X. Moreover, the rim of the gate oxide 6 is to overlap the programing region, so that within the borders of the projecting portion Cp of the extension Cf, the programing region Pz of increased substrate doping, as superficially inserted into the substrate, will come to lie below the gate oxide area Co.

In this way, and with reference to the aforementioned article by W. M. Gosney, it will become understandable that in the case of a negative polarity of the gate electrode G, the area at the rim 8 of the programing line region X can become effective as a minority injector of hot holes and, in the case of a positive polarity of the gate electrode G, the area of the rim 7 of the programing region Pz will become effective as a minority injector of hot electrons.

After the manufacture of the gate oxide 6 if necessary by providing it with a thin oxide window 2, the floating gate Fg is deposited which preferably consists of polycrystalline silicon, because this material, by way of thermal oxidation, can easily be provided with an insulating surface layer (superficially oxidized) which is necessary for electrically isolating the floating gate Fg from the control gate G. In FIG. 2, the rim portion of the floating gate is emphasized by the hatchlines. It is of frame-shaped design provided with a recess 9 including the channel area Ca of the selection transistor Ta. In this way, there is obtained an optimum large coupling capacity between the floating gate Fg overlapping the adjoining gate oxide 4, and the gate electrode G, with the latter completely covering the former.

Finally, the floating gate Fg is superficially oxidized and, as is illustrated in FIG. 2, there is deposited the control gate G which is of tape-shaped design, covering the superficially oxidized floating gate Fg and, consequently, also the channel area Ca of the selection transistor Ta. The just mentioned control gate G, apart from the contacted line regions X and Y, forms the third electrode of the memory cell according to the invention. In this way, the channel area Cs of the memory transistor Ts directly extends into the channel area Ca of the selection transistor Ta and comes to lie within a common gate oxide area Co which, on the side of the selection transistor, overlaps the reading line region Y.

Figure 3:
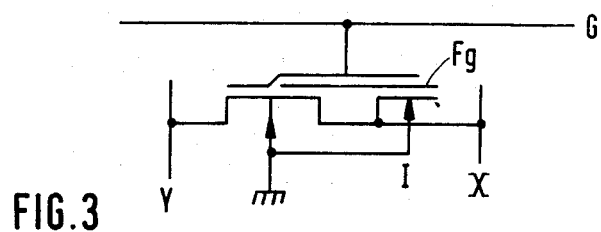
FIG. 3 shows the circuit diagram symbol of the floating-gate memory cell according to the invention.

FIG. 3 symbolically shows the floating gate memory cell according to the invention including the reading line region Y, the programing line region X, the injector I, the gate G and the floating gate Fg. With the aid of such a memory cell, it is possible to build up memory matrices having m×m storage positions. By employing suitable peripheral circuits including decoding, logic and potential selection circuits, it is possible, in accordance with the input of binary code signals, to achieve
  (a) the bitwise erasing and writing
  (b) the rowwise erasing and writing, or else
  (c) the columnwise erasing or writing.

In FIG. 6 there is shown a 2×2 matrix containing four memory cells according to the invention, numbered 11, 12, 21 and 22. The Table in FIG. 7 also shows the voltages to be applied to the two gate lines G1 and G2, to the two programing line regions X1 and X2 as well as to the two reading line regions Y1 and Y2 in order thus to effect the functions shown in the first column of the Table.

Wherein:
$U_p$ indicates the programing voltage required for the erasing and the writing,
$U_R$ and $U_D$ indicate the gate or drain voltage necessary for reading, which voltages may be equally high, but have to be chosen substantially smaller than $U_p$.

In the rows of the Table there are shown the following functions ($U_p \rightarrow 0$):
E11: Only the cell 11 is erased. Holes are injected into the floating gate. The threshold voltage of the n-channel memory transistor is reduced.
W11: Only the cell 11 is written. Electrons are injected into the floating gate. The threshold voltage of the n-channel memory transistor is increased if necessary to such an extent that it changes its sign, i.e., becomes negative and, consequently, lets the memory transistor become a depletion transistor.
R11: Only the cell 11 is read.
R11,12: The row 1 of the memory matrix including the cells 11 and 12 is read out simultaneously (in parallel).
B11,12: Row 1 is erased.
W11,12: Row 1 is written.
B11,21: Column 1 is erased.
W11,21: Column 1 is written.

FIG. 4 relates to the example of embodiment of a memory cell according to the invention in which the marginal line, or edge, of the programming region Pz is shown to intersect the margin (rim portion) of the programming line region X within the programming window by forming an angle $\phi$ of approximately 60°.

Figure 5:
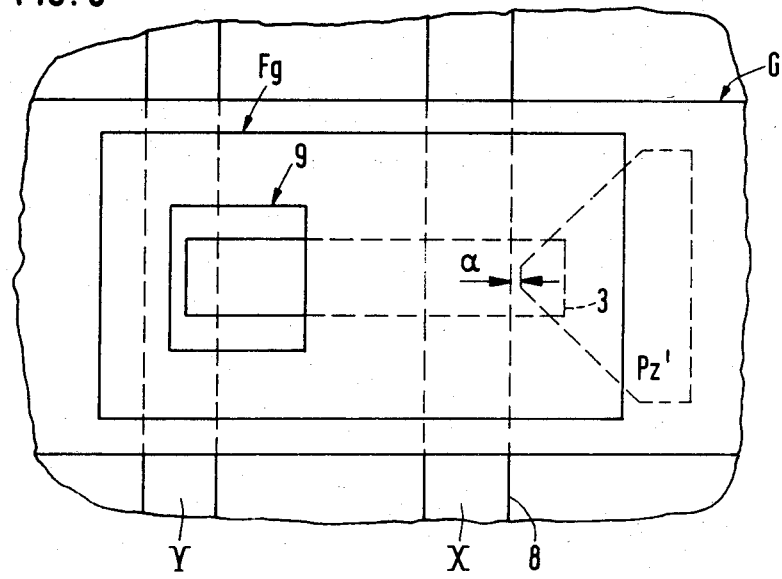
FIG. 5 shows another embodiment of the present invention.

FIG. 5 relates to the example of embodiment of a memory cell according to the invention in which the programing region Pz does not overlap the programing line region X, but, within the programming window, comes close with its margin, or edge, to the margin, or edge, of the programing line region X with the exception of the distance a between zero and 6 μm. By choosing the angle $\phi$ or the distance a, it is possible to achieve a maximum field intensity by employing a small as possible programming voltage for the optimum injection of electrons and holes.

What is claimed is:

1. A floating gate memory cell in which writing and erasing are effected by the injection of hot charge carriers comprising:
    a substrate having a first selected doping;
    a memory transistor coupled to a selection transistor and carried by said substrate, said transistors formed as insulated gate field effect transistors;
    a reading line formed in said substrate adjacent said selection transistor;
    a programming line formed in said substrate adjacent said memory transistor;
    said transistors each including a channel region wherein said channel region of said memory transistor is directly coupled to said channel region of said selection transistor with said channel regions located between said lines;
    a common-gate oxide area of a thickness formed on said substrate overlying said channels, as well as a region of said reading line and extending a selected distance across a region of said programming line and over said substrate forming an extension region;
    a programming region of a second selected doping formed in said substrate at a surface thereof beneath said extension region of said oxide with said programming region having the same type of doping as said substrate;
    a floating gate formed over a region of said oxide area, said gate overlying said channel of said memory transistor, said programming line and a selected part of said programming region, exclusive of that part of said oxide that overlies said channel of said selection transistor; and
    a control gate overlying said floating gate, insulated therefrom, and said oxide;
    said control gate, said reading line and said programming line all forming electrodes of the memory cell.

2. A memory cell as claimed in claim 11, wherein said gate oxide within the area of said extension region comprises a window of said oxide having a selected thickness less than said thickness of said gate oxide over said channel areas and with a selected edge thereof intersecting a selected edge of said programming region as well as a selected edge of said programming line.

3. A memory cell as claimed in claim 2, wherein said programming region does not overlap said programming line, and is spaced therefrom within said window (2), by a spacing ranging between 0 and 6 $\mu$m.

4. A memory cell as claimed in claim 2, wherein said programming region overlaps said programming line within said window.

5. A memory cell as claimed in claim 4, wherein said edge of said programming line together with said edge of said programming region within said window forms an angle ranging between $-60°$ and $+60°$ in relation to a normal line to said edge of said programming line.

6. A memory cell as claimed in any one of claims 2 to 5, wherein said floating gate is of frame-shaped design provided with a recess which includes said channel area of said selection transistor.

7. A memory cell as claimed in any one of claims 2 to 5, wherein said control gate completely covers said floating gate.

8. A memory cell as claimed in any one of claims 2 to 5, wherein said floating gate comprises a doped polycrystalline silicon material.

9. A memory cell as claimed in any one of claims 2 to 5, wherein said control gate comprises doped polycrystalline silicon material.

10. A memory cell as claimed in any one of claims 2 to 5, wherein said control gate comprises a metal.

* * * * *